(12) United States Patent
Aspnes et al.

(10) Patent No.: US 11,038,293 B2
(45) Date of Patent: Jun. 15, 2021

(54) POWER BAR PACKAGE MOUNT ARRANGEMENT

(71) Applicant: Intel Corporation, Santa Clara, CA (US)

(72) Inventors: Brian D. Aspnes, Portland, OR (US); Jeffory L. Smalley, Olympia, WA (US); Weimin Shi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 645 days.

(21) Appl. No.: 15/869,345

(22) Filed: Jan. 12, 2018

(65) Prior Publication Data
US 2019/0044264 A1 Feb. 7, 2019

(51) Int. Cl.
| | |
|---|---|
| *H05K 7/00* | (2006.01) |
| *H05K 1/00* | (2006.01) |
| *H01R 12/70* | (2011.01) |
| *H05K 1/18* | (2006.01) |
| *H05K 1/11* | (2006.01) |
| *H01R 12/71* | (2011.01) |
| *H05K 1/02* | (2006.01) |
| *H01R 12/72* | (2011.01) |

(52) U.S. Cl.
CPC ..... *H01R 12/7088* (2013.01); *H01R 12/7076* (2013.01); *H01R 12/716* (2013.01); *H01R 12/721* (2013.01); *H05K 1/0215* (2013.01); *H05K 1/11* (2013.01); *H05K 1/181* (2013.01); *H01R 12/7058* (2013.01); *H05K 2201/10272* (2013.01); *H05K 2201/10325* (2013.01)

(58) Field of Classification Search
CPC .... H01R 2/7088; H01R 2/7076; H01R 2/716; H01R 2/721; H01R 2/7058; H05K 1/0215; H05K 1/11; H05K 1/181
See application file for complete search history.

(56) References Cited

U.S. PATENT DOCUMENTS

| | | | |
|---|---|---|---|
| 4,858,070 A * | 8/1989 | Buron | B22C 1/2253 361/695 |
| 5,940,288 A * | 8/1999 | Kociecki | H05K 7/20727 361/688 |
| 6,724,639 B2 * | 4/2004 | Tsai | H05K 5/0069 361/784 |
| 6,797,880 B2 * | 9/2004 | Kirchberger | H02M 7/003 174/50 |

(Continued)

*Primary Examiner* — Anthony M Haughton
(74) *Attorney, Agent, or Firm* — Schwabe, Williamson & Wyatt, P.C.

(57) ABSTRACT

Apparatuses and systems associated with power provision for packages mounted to a printed circuit board are disclosed herein. In embodiments, a socket arrangement may include a header and a first bus bar, wherein the first bus bar is to extend from the header adjacent to the PCB, and is to electrically couple to a power supply contact of a component package and to a power supply connection within a proximity of a power source, wherein a power output of the power source is electrically coupled to the power supply connection. The socket arrangement may further include a second bus bar, wherein the second bus bar is to extend from the header adjacent to the PCB, and is to electrically couple to a ground contact of the component package and a ground connection within the proximity of the power source. Other embodiments may be described and/or claimed.

20 Claims, 8 Drawing Sheets

(56) References Cited

U.S. PATENT DOCUMENTS

| | | | |
|---|---|---|---|
| 7,940,532 B2 * | 5/2011 | Willing | H02M 7/003 |
| | | | 361/807 |
| 2002/0195262 A1 * | 12/2002 | Kirchberger | H02M 7/003 |
| | | | 174/521 |
| 2009/0091897 A1 * | 4/2009 | Willing | H02M 7/003 |
| | | | 361/752 |
| 2010/0020516 A1 * | 1/2010 | Kishino | H05K 7/1432 |
| | | | 361/803 |
| 2017/0346205 A1 * | 11/2017 | Eriksson | H01R 12/721 |
| 2019/0214745 A1 * | 7/2019 | Uchida | H05K 5/0069 |

* cited by examiner

POWER BAR PACKAGE MOUNT ARRANGEMENT

TECHNICAL FIELD

The present disclosure relates to the field of electronic circuits. More particularly, the present disclosure relates to power provision for semiconductor packages mounted to a printed circuit board.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

As computer components evolve, often through an increase in speed of the computer components and/or an increase in an amount of elements within the computer components, additional power may be needed to power the computer components. In the instance of semiconductor packages, the legacy approach to provide increased power is to introduce additional layers for power and ground traces to the printed circuit boards to which the semiconductor packages are mounted to provide the increased power to the semiconductor packages. However, the introduction of additional layers to the printed circuit boards is costly and may become impractical at some point.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
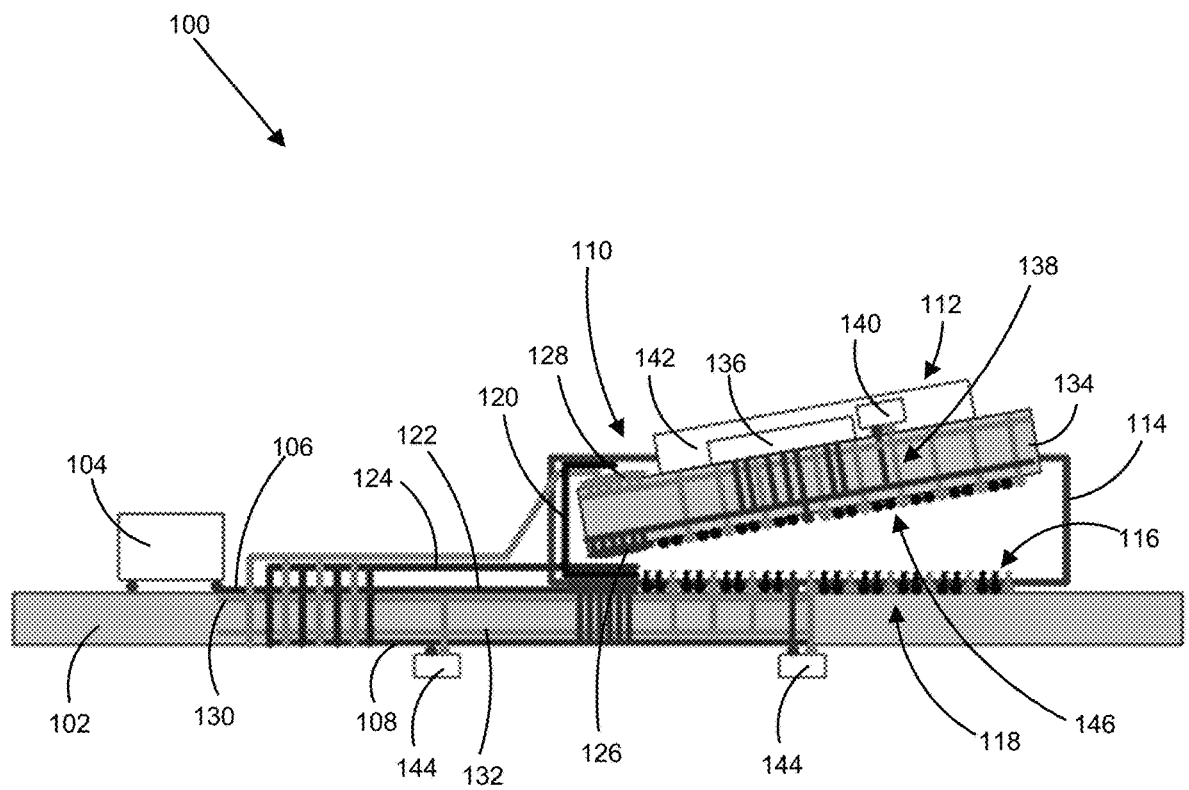
FIG. 1 illustrates a representation of an example circuit board assembly, according to various embodiments.

Apparatuses and systems associated with power provision for packages mounted to a printed circuit board are disclosed herein. In embodiments, a socket arrangement may include a header and a first bus bar, wherein the first bus bar is to extend from the header adjacent to the printed circuit board (PCB), and is to electrically couple to a power supply contact of a component package and to a power supply connection within a proximity of a power source, wherein a power output of the power source is electrically coupled to the power supply connection. The socket arrangement may further include a second bus bar, wherein the second bus bar is to extend from the header adjacent to the PCB, and is to electrically couple to a ground contact of the component package and a ground connection within the proximity of the power source.

The apparatuses and systems described herein, and in particular the sockets, may provide for power provision from a power source to a semiconductor package via a first bus bar and a second bus bar. The addition of the pathway for providing power may provide for less voltage drop of the power from the power source to the semiconductor package. Further, the addition of the pathway for providing power may allow for greater power to be provided to the semiconductor package than legacy approaches without adding additional power and/or ground layers to printed circuit boards to support the additional power. This may result in cost and/or power savings through implementation of the apparatuses and systems described herein.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

As used herein, the term "couple," and gerunds thereof, may refer to physical coupling, electrical coupling, or some combination thereof.

FIG. 1 illustrates a representation of an example circuit board assembly 100, according to various embodiments. The circuit board assembly 100 may include a printed circuit board (PCB) 102. The PCB 102 may be a multi-layered PCB. For example, the PCB 102 may include multiple layers, wherein the layers alternate between power layers and ground layers. Each of the layers of the PCB 102 may include one or more traces utilized for routing power signals, ground signals, input/output signals, or some combination thereof.

The circuit board assembly 100 may further include a power source 104. The power source 104 may be mounted to the PCB 102 and may provide power to one or more of the components of the PCB 102. The power source 104 may be a power supply mounted to the PCB 102 that provides power to the one or more components of the PCB 102. In some embodiments, the power source 104 may include a voltage regulator, wherein the voltage regulator is to provide power to one or more of the components of the PCB 102. In particular, the power source 104 may provide power to a semiconductor package 112 via a socket arrangement 110.

A contact of the power source 104 may couple to one or more traces of the PCB 102 and may output power to the one or more traces. In particular, the contact of the power source 104 may output a positive voltage output to the one or more traces of the PCB 102. The traces coupled to the contact of the power source 104 may be located in one layer or multiple layers of the PCB 102. In the illustrated embodiment, first power trace line 106 and second power trace line 108 represent traces of the PCB 102 coupled to the contact of the power source 104. The first power trace line 106 may be located in a first layer (as indicated by being located near a top of the PCB 102) and the second power trace line 108 may be located in a second layer (as indicated by being located near a bottom of the PCB 102) of the PCB 102.

The PCB 102 may further include other traces coupled to a ground of the PCB 102. In particular, the traces may be coupled to a ground point of the PCB 102, such as a fastener that couples the PCB 102 to a chassis. In some embodiments, the traces may be further coupled to another contact of the power source 104, wherein the contact is a ground contact of the power source 104. In other embodiments, the traces may be coupled to a negative voltage output of the power source 104 rather than being coupled to the ground of the PCB 102. In the illustrated embodiment, first ground trace line 130 and second ground trace line 132 represent the traces of the PCB 102 coupled to the ground of the PCB 102 or the negative voltage output of the power source 104. The first ground trace line 130 may be located in a third layer (as indicated by being located near a top of the PCB 102) and the second ground trace line 132 may be located in a fourth layer (as indicated by being located near a bottom of the PCB 102) of the PCB 102.

The circuit board assembly 100 may further include a socket arrangement 110. The socket arrangement 110 may be mounted to the PCB 102 and may be utilized for mounting a semiconductor package 112 to the PCB 102. In particular, the socket arrangement 110 may include a body 114 that is mounted to the PCB 102, wherein the body 114 may mount the semiconductor package 112 to the PCB 102. The body 114 may receive the semiconductor package 112 and may maintain the semiconductor package 112 mounted to the PCB 102. In some embodiments, the socket arrangement 110 may be similar to a small outline dual in-line memory module (SODIMM) socket, wherein the semiconductor package 112 may be received by the body 114 in a same manner as a component is received within a SODIMM socket.

The body 114 may include a plurality of pins 116. The plurality of pins 116 may be located in a portion of the body 114 that abuts the PCB 102 when the socket arrangement 110 is mounted to the PCB 102. The plurality of pins 116 may be coupled to a plurality of contacts 118 of the PCB 102. The plurality of pins 116 may further be coupled to a plurality of contacts 146 of the semiconductor package 112 when the semiconductor package 112 is received within the body 114. The plurality of contacts 146 of the semiconductor package 112 may include a power supply contact and a ground contact of the semiconductor package 112. Accordingly, the plurality of pins 116 may provide coupling between the plurality of contacts 118 of the PCB 102 and the plurality of contacts 146 of the semiconductor package 112. The coupling of the plurality of contacts 118 of the PCB 102 and the plurality of contacts 146 of the semiconductor package 112 may provide for the plurality of contacts 146 to be coupled to a ground of the PCB 102, power being supplied by the power source 104, input/output (I/O) signals of the PCB 102, the first power trace line 106, the second power trace line 108, the first ground trace line 130, the second ground trace line 132, or some combination thereof. In some embodiments, a first portion of the plurality of contacts 118 of the PCB 102 may be coupled to the first power trace line 106 and/or the second power trace line 108, and a second portion of the plurality of contacts 118 may be coupled to the first ground trace line 130 and/or the second ground trace line 132. In these embodiments, the first portion of the plurality of contacts 118 of the PCB 102 may provide power to a first portion of the plurality of contacts 146 of the semiconductor package 112, and the second portion of the plurality of contacts 118 of the PCB 102 may couple a ground of the PCB 102 to a second portion of the plurality of contacts 146 of the semiconductor package 112.

The socket arrangement 110 may further include a header 120. The header 120 may be mounted to the PCB 102 and may be coupled to the body 114 of the socket arrangement 110. The header 120 may receive a portion of the semiconductor package 112. The header 120 may include a first contact (see first contact 216 (FIG. 2)) and a second contact (see second contact 218 (FIG. 2)) located within the header 120. The first contact and the second contact may couple to contacts of the semiconductor package 112. For example, the first contact may couple to a ground contact 128 of the semiconductor package 112 and the second contact may couple to a power supply contact 126 of the semiconductor package 112. The power supply contact 126 and the ground contact 128 may be pads located on surfaces of the semiconductor package 112. The power supply contact 126 may be located on a first surface of the semiconductor package 112 and the ground contact 128 may be located on a second surface of the semiconductor package 112, wherein the second surface is opposite to the first surface.

The socket arrangement 110 may further include a first bus bar 122 and a second bus bar 124. The first bus bar 122 and the second bus bar 124 may comprise electrically conductive material. In some embodiments, the first bus bar 122 and the second bus bar 124 may comprise an electrically conductive metal, such as copper, silver, gold, aluminum, or some combination thereof. The first bus bar 122 and the second bus bar 124 may provide for relatively low impedance transmission of signals.

Further, the first bus bar 122 and the second bus bar 124 may be a rigid material that resists deformation. The first bus bar 122 and the second bus bar 124 may be coupled to the header 120. In some embodiments, the first bus bar 122 may be coupled to a first side of the header 120 and the second bus bar 124 may be coupled to a second side of the header 120, wherein the second side of the header 120 may be located opposite to the first side of the header 120. Further, the first bus bar 122 may be coupled to the first contact of the header 120 and the second bus bar 124 may be coupled to the second contact of the header 120. In some embodiments, a portion of the first bus bar 122 may be the first contact of the header 120, a portion of the second bus bar 124 may be the second contact of the header 120, or some combination thereof.

The first bus bar 122 and the second bus bar 124 may extend from the header 120 adjacent to a surface of the PCB 102. In particular, the first bus bar 122 and the second bus bar 124 may extend from the header 120 toward the power source 104 and adjacent to the surface of the PCB 102. In some embodiments, a portion of the first bus bar 122 and a portion of the second bus bar 124 may extend from the header 120 parallel to the surface of the PCB 102 toward the power source 104. The first bus bar 122 and the second bus bar 124 may be separated by air, a non-conductive material, or some combination thereof.

The first bus bar 122 may be coupled to a power supply connection within a proximity of the power source 104. The first bus bar 122 may be coupled to the power supply connection at a first end of the first bus bar 122 that is opposite to a second end of the first bus bar 122 that is coupled to the first contact of the header 120. Within the proximity of the power source 104 may be defined as within five millimeters of a keep-out zone of the power source 104 and/or within five millimeters of the power source 104. In some embodiments, the proximity may be defined by a midpoint between the power source 104 and the socket arrangement 110, wherein being within the proximity of the power source 104 refers to being closer to the power source 104 than to the socket arrangement 110. The power supply connection may include one or more traces, layers, or some combination thereof, of the PCB 102, wherein the first bus bar 122 may be coupled by being soldered to PCB 102 at one or more features coupled to the power supply connection, such as pads of the PCB 102, apertures of the PCB 102, through-holes of the PCB 102, or some combination thereof. In some embodiments, the power supply connection may include the first power trace line 106 and/or the second power trace line 108. In other embodiments, the power supply connection may be a contact of the power source 104, may be a fixture coupled to a contact of the power source 104, or some combination thereof. The power supply connection may be coupled to a power output of the power source 104, which may be a positive voltage output of the power source 104.

The second bus bar 124 may be coupled to a ground connection within the proximity of the power source 104. The second bus bar 124 may be coupled to the power supply connection at a first end of the second bus bar 124 that is opposite to a second end of the second bus bar 124 that is coupled to the second contact of the header 120. As noted above, within the proximity of the power source 104 may be defined as within five millimeters of a keep-out zone of the power source 104 and/or within five millimeters of the power source 104. In some embodiments, the proximity may be defined by a midpoint between the power source 104 and the socket arrangement 110, wherein being within the proximity of the power source 104 refers to being closer to the power source 104 than to the socket arrangement 110. The ground connection may include one or more traces, layers, or some combination thereof, of the PCB 102, wherein the second bus bar 124 may be coupled by being soldered to the PCB 102 at one or more features coupled to the ground connection, such as pads of the PCB 102, apertures of the PCB 102, through-holes of the PCB 102, or some combination thereof. In some embodiments, the ground connection may include the first ground trace line 130 and/or the second ground trace line 132. In other embodiments, the ground connection may be a contact of the power source 104, may be a fixture coupled to a contact of the power source 104, or some combination thereof. The ground connection may be coupled to a ground contact of the power source 104, a ground of the PCB 102, a negative voltage output of the power source 104, or some combination thereof.

The semiconductor package 112 may include a component package 134. The component package 134 may include a non-conductive material with one or more conductive elements 138 that extend within the non-conductive material to provide routing of connections. In some embodiments, the component package 134 may include a dielectric material with one or more vias, traces, or some combination thereof, that extend within the dielectric material. The component package 134 may include the plurality of contacts 146 of the semiconductor package 112, the power supply contact 126, and the ground contact 128. The ground contact 128 may be located on a first side of the component package 134 and the power supply contact 126 may be located on a second side of the component package 134. In some embodiments, the first side of the component package 134 with the ground contact 128 may be opposite to the second side of the component package 134 with the power supply contact 126. In some embodiments, the plurality of contacts 146 may be located on the second side of the component package 134 and may be located adjacent to the power supply contact 126. In other embodiments, the plurality of contacts 146 may be located on the first side of the component package 134 and may be located adjacent to the ground contact 128.

The component package 134 may further include a die 136. The die 136 may be coupled to a side of the component package 134. In some embodiments, the die 136 may be coupled to the first side of the component package 134 and may be located adjacent to the ground contact 128. In other embodiments, the die 136 may be coupled to the second side of the component package 134 and may be located adjacent to the power supply contact 126. The conductive elements 138 may couple the die 136 to one or more of the contacts of the component package 134, including the power supply contact 126, the ground contact 128, and/or the plurality of contacts 146. In some embodiments, the conductive elements 138 may further couple the power supply contact 126, the ground contact 128, the plurality of contacts 146, or some combination thereof, together. In the illustrated embodiment, the conductive elements 138 may couple the power supply contact 126 to a first portion of the plurality of contacts 146 and the power supply contact 126 to a second portion of the plurality of contacts 146.

In some embodiments, the semiconductor package 112 may further include a capacitor 140 and a heat spreader 142. The capacitor 140 may be coupled to a side of the component package 134. In some embodiments, the capacitor 140 may be coupled to the first side of the component package 134 and may be located adjacent to the die 136. The conductive elements 138 may couple the capacitor 140 to the power supply contact 126, the ground contact 128, the plurality of contacts 146, or some combination thereof. The heat spreader 142 may be located on the first side of component package 134 and may at least partially encompass the die 136 and the capacitor 140. The heat spreader 142 may include a thermally conductive material and may conduct heat from the die 136 and/or the capacitor 140. In some embodiments, the capacitor 140, the heat spreader 142, or both may be omitted.

The component package 134 may be received by the socket arrangement 110. In particular, when the body 114 receives the semiconductor package 112, the component package 134, or some portion thereof, may be located within the body 114. Further, when the header 120 receives the portion of the semiconductor package 112, a portion of the component package 134 may be located within the header 120. When the component package 134 received by the socket arrangement 110, the second bus bar 124 may be coupled to the ground contact 128, the first bus bar 122 may be coupled to the power supply contact 126, and the plurality of contacts 146 of the component package 134 may be coupled to the plurality of contacts 118 of the PCB 102.

The first bus bar 122 may couple the power supply contact 126 to the first power trace line 106, the second power trace line 108, an output of the power source 104 (which may provide power to the component package 134), or some combination thereof. Further, a first portion of the plurality of contacts 118 of the PCB 102 may couple a first portion of the plurality of contacts 146 of the component package 134 to the first power trace line 106, the second power trace line 108, the output of the power source 104, or some combination thereof. The conductive elements 138 may couple the power supply contact 126 to the first portion of the plurality of contacts 146. Further, the conductive elements 138 may couple the power supply contact 126 and the first portion of the plurality of the contacts 146 to the die 136. Accordingly, there may be two separate pathways coupling power to the die 136: a first pathway provided by the first bus bar 122, and a second pathway provided by the first power trace line 106 and the second power trace line 108.

The second bus bar 124 may couple the ground contact 128 to the first ground trace line 130, the second ground trace line 132, the ground of the PCB 102, or some combination thereof. Further, a second portion of the plurality of contacts 118 of the PCB 102 may couple a second portion of the plurality of contacts 146 of the component package 134 to the first ground trace line 130, the second ground trace line 132, the ground of the PCB 102, or some combination thereof. The conductive elements 138 may couple the ground contact 128 to the second portion of the plurality of contacts 146. Further, the conductive elements 138 may couple the ground contact 128 and the second portion of the plurality of contacts 146 to the die 136. Accordingly, there may be two separate pathways coupling the ground of the PCB 102 to the die 136: a first pathway provided by the second bus bar 124, and a second pathway provided by the first ground trace line 130 and the second ground trace line 132.

In some embodiments, the circuit board assembly 100 may further include one or more capacitors 144 mounted to the PCB 102. The capacitors 144 may be coupled to the first power trace line 106, the second power trace line 108, the first ground trace line 130, the second ground trace line 132, or some combination thereof. The capacitors 144 may facilitate transmission of high frequency signals (such as alternating current (AC) signals) on the first power trace line 106, the second power trace line 108, the first ground trace line 130, the second ground trace line 132, or some combination thereof In these embodiments, a majority of the high frequency signals between the power source 104 and the semiconductor package 112 may be transmitted via the first power trace line 106, the second power trace line 108, the first ground trace line 130, the second ground trace line 132, or some combination thereof, whereas low frequency signals (such as direct current (DC) signals) may be transmitted via the first bus bar 122 and the second bus bar 124.

In other embodiments, the capacitors 144 may be omitted and/or capacitors may be coupled to the first bus bar 122 and the second bus bar 124. In embodiments with capacitors coupled to the first bus bar 122 and the second bus bar 124, the capacitors may be located at the outer surfaces of the first bus bar 122 and/or the second bus bar 124, between the first bus bar 122 and the second bus bar 124, or some combination thereof. Further, a non-conductive material may at least partially encompass the capacitors and may facilitate prevention of shorting between the first bus bar 122 and the second bus bar 124.

Figure 2:
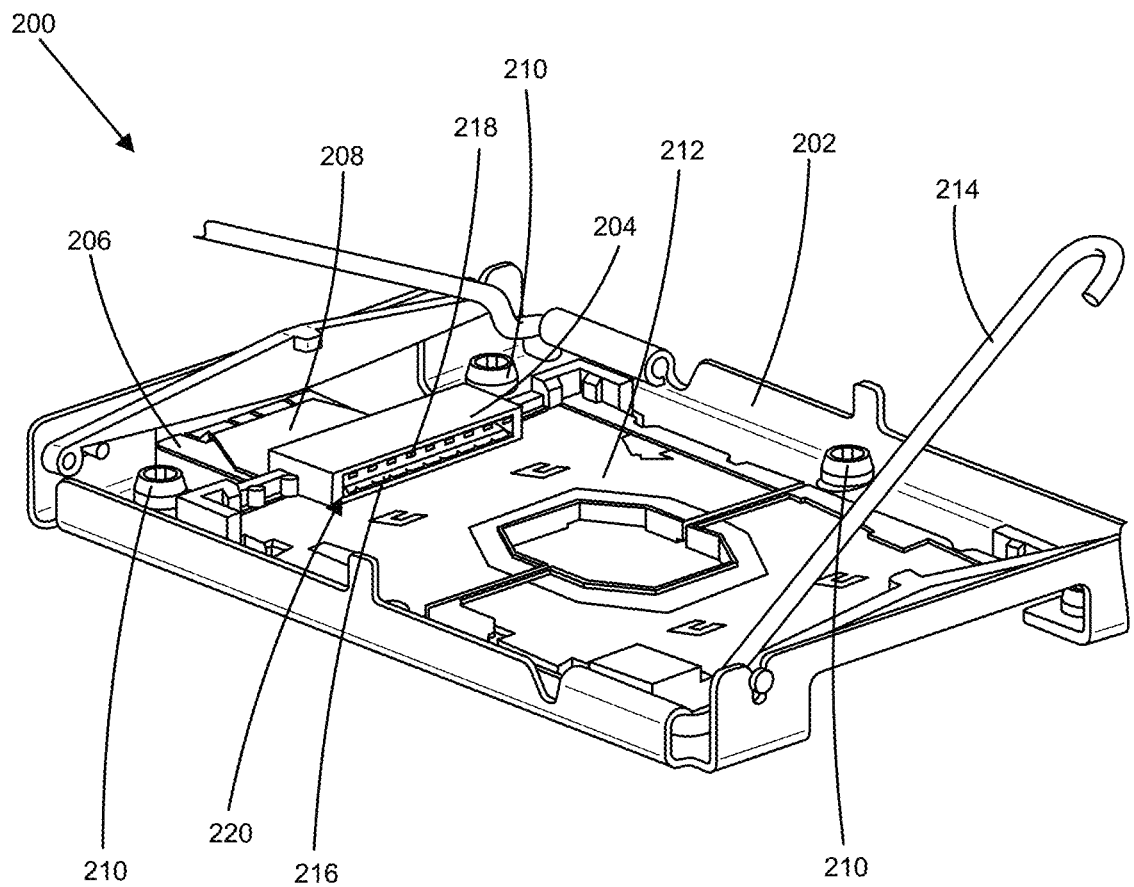
FIG. 2 illustrates an example socket arrangement, according to various embodiments.

FIG. 2 illustrates an example socket arrangement 200, according to various embodiments. The socket arrangement 200 may include one or more of the features of the socket arrangement 110 (FIG. 1). For example, the socket arrangement 200 may include a body 202, a header 204, a first bus bar 206, and a second bus bar 208, which may include one or more of the features of the body 114 (FIG. 1), the header 120 (FIG. 1), the first bus bar 122 (FIG. 1), and the second bus bar 124 (FIG. 1), respectively.

The body 202 may be mounted to a PCB, such as the PCB 102 (FIG. 1). In the illustrated embodiment, the body 202 may be mounted to the PCB by one or more fasteners 210. In other embodiments, the body 202 may be mounted to the PCB by epoxy, fixtures, solder, the fasteners 210, or some combination thereof.

The body 202 may receive a semiconductor package, such as the semiconductor package 112 (FIG. 1). The body 202 may include a recess 212 located in the body into which the semiconductor package may be received. The body 202 may further include one or more mounting members 214 that maintain a position of the semiconductor package once received within the recess 212.

The body 202 may include a plurality of pins (such as the plurality of pins 116 (FIG. 1)). The plurality of pins may be located in a portion of the body 202 that is to abut the PCB and may extend into the recess 212. The plurality of pins may couple to a plurality of contacts (such as the plurality of contacts 118 (FIG. 1)) of the PCB and may provide coupling between the plurality of contacts of the PCB and a plurality of contacts (such as the plurality of contacts 146 (FIG. 1)) of the semiconductor package when the semiconductor package is inserted within the socket arrangement 200.

The header 204 may be coupled to the body 202 and may be located at a side of the recess 212. The header 204 may receive a portion of the semiconductor package when the semiconductor package is positioned within the body 202. In particular, the portion of the semiconductor package received by the header 204 may include one or more contacts, such as the power supply contact 126 (FIG. 1) and/or the ground contact 128 (FIG. 1). The header 204 may have an opening 220 into which the portion of the semiconductor package is received. The portion of the semiconductor package may be a portion of a component package, such as the component package 134 (FIG. 1).

The header 204 may further include a first contact 216 and a second contact 218. The first contact 216 and the second contact 218 may be located within the opening 220 of the header 204. In some embodiments, the first contact 216 may be located on a first side of the opening 220 and the second contact 218 may be located on a second side of the opening 220, wherein the first side of the opening 220 may be opposite to the second side of the opening 220.

The portion of the semiconductor package may be positioned between the first contact 216 and the second contact 218 when the portion of the semiconductor package is received within the opening. The first contact 216 may contact a first side of the portion of the semiconductor package and the second contact 218 may contact a second side of the portion of the semiconductor package, wherein the first side of the portion of the semiconductor package may be opposite to the second side of the portion of the semiconductor package. In particular, the first contact 216 may contact a first contact (such as the power supply contact 126) of the portion of the semiconductor package, which may result in coupling of the first contact 216 and the first contact of the portion of the semiconductor package. The second contact 218 may contact a second contact (such as the ground contact 128) of the portion of the semiconductor package, which may result in coupling of the second contact 218 and the second contact of the portion of the semiconductor package.

The first bus bar 206 may be coupled to the first contact 216 of the header 204. The first bus bar 206 may extend from the header 204 adjacent to the PCB and may couple to a power supply connection (such as the power supply connection described in relation to FIG. 1). In some embodiments, the first contact 216 may be a portion of the first bus bar 206 that extends into the header 204 and contacts the portion of the semiconductor package.

The second bus bar 208 may be coupled to the second contact 218 of the header 204. The second bus bar 208 may extend from the header 204 adjacent to the PCB and may couple to a ground connection (such as the ground connection described in relation to FIG. 1). In some embodiments, the second contact 218 may be a portion of the second bus bar 208 that extends into the header 204 and contacts the portion of the semiconductor package.

Figure 3:
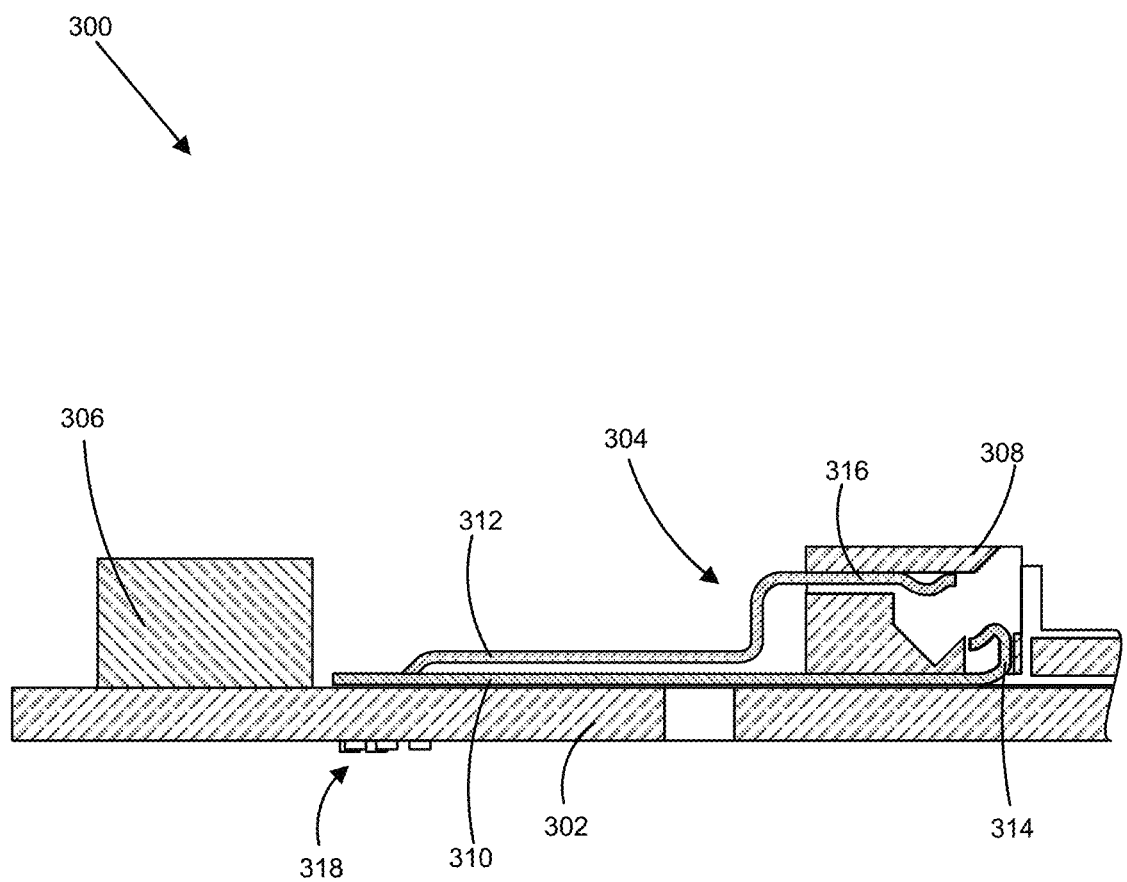
FIG. 3 illustrates a cross-sectional view of an example package mount arrangement, according to various embodiments.

FIG. 3 illustrates a cross-sectional view of an example package mount arrangement 300, according to various embodiments. The package mount arrangement 300 may include one or more of the features of the circuit board assembly 100 (FIG. 1). In particular, the package mount arrangement 300 may include a PCB 302 with a socket arrangement 304 and a power source 306 mounted to the PCB 302. Further, the PCB 302, the socket arrangement 304, and the power source 306 may include one or more of the features of the PCB 102 (FIG. 1), the socket arrangement 110 (FIG. 1), and the power source 104 (FIG. 1), respectively.

The socket arrangement 304 may include a header 308. The socket arrangement 304 may further include a first bus bar 310 and a second bus bar 312. A portion of the first bus bar 310 may extend into the header 308 and may form a first contact 314. The first contact 314 may contact a first side of a semiconductor package (such as the semiconductor package 112 (FIG. 1)) when a portion of the semiconductor package is received within the header 308. In particular, the first contact 314 may contact a first contact (such as the power supply contact 126 (FIG. 1)) when the portion of the semiconductor package is received within the header 308. In other embodiments, the first contact 314 may be a separate element from the first bus bar 310 and may be coupled to the first bus bar 310.

A portion of the second bus bar 312 may extend into the header 308 and may form a second contact 316. The second contact 316 may contact a second side of the semiconductor package when a portion of the semiconductor package is received within the header 308. The second side of the semiconductor package may be opposite to the first side of the semiconductor package. In particular, the second contact 316 may contact a second contact (such as the ground contact 128 (FIG. 1)) when the portion of the semiconductor package is received within the header 308. In other embodiments, the second contact 316 may be a separate element from the second bus bar 312 and may be coupled to the second bus bar 312.

The first bus bar 310 and the second bus bar 312 may extend from the header 308 adjacent to the PCB 302. The first bus bar 310 may couple to a power supply connection (such as the power supply connection described in relation to FIG. 1) at a first end of the first bus bar 310 that may be opposite to a second end of the first bus bar 310 that extends within the header 308. The second bus bar 312 may couple to a ground connection (such as the ground connection described in relation to FIG. 1) at a first end of the second bus bar 312 that may be opposite to a second end of the second bus bar 312 that extends within the header 308. In the illustrated embodiment, the first bus bar 310 and the second bus bar 312 may extend from the header 308 to a plurality of posts 318 that couple the first bus bar 310 to the power supply connection and the second bus bar 312 to the ground connection. In particular, a first portion of the plurality of posts 318 may be coupled to the first bus bar 310 and may couple the first bus bar 310 to the power supply connection. Further, a second portion of the plurality of posts 318 may be coupled to the second bus bar 312 and may couple the second bus bar 312 to the ground connection. The plurality of posts 318 may extend through a plurality of holes formed in the PCB 302 and may be soldered within the plurality of holes to provide the coupling to the power supply connection and the ground connection.

The power source 306 may be mounted to the PCB 302 adjacent to socket arrangement 304. In particular, the power source 306 may be mounted adjacent to the first bus bar 310 and the second bus bar 312 of the socket arrangement 304. The plurality of posts 318 may be located within a proximity of the power source 306. In particular, the plurality of posts 318 may be located closer to the power source 306 than to the header 308. In some embodiments, the plurality of posts 318 may be located at an edge of a keep-out zone of the power source 306, within five millimeters of the keep-out zone of the power source 306, within five millimeters of the power source 306, or some combination thereof.

Figure 4:
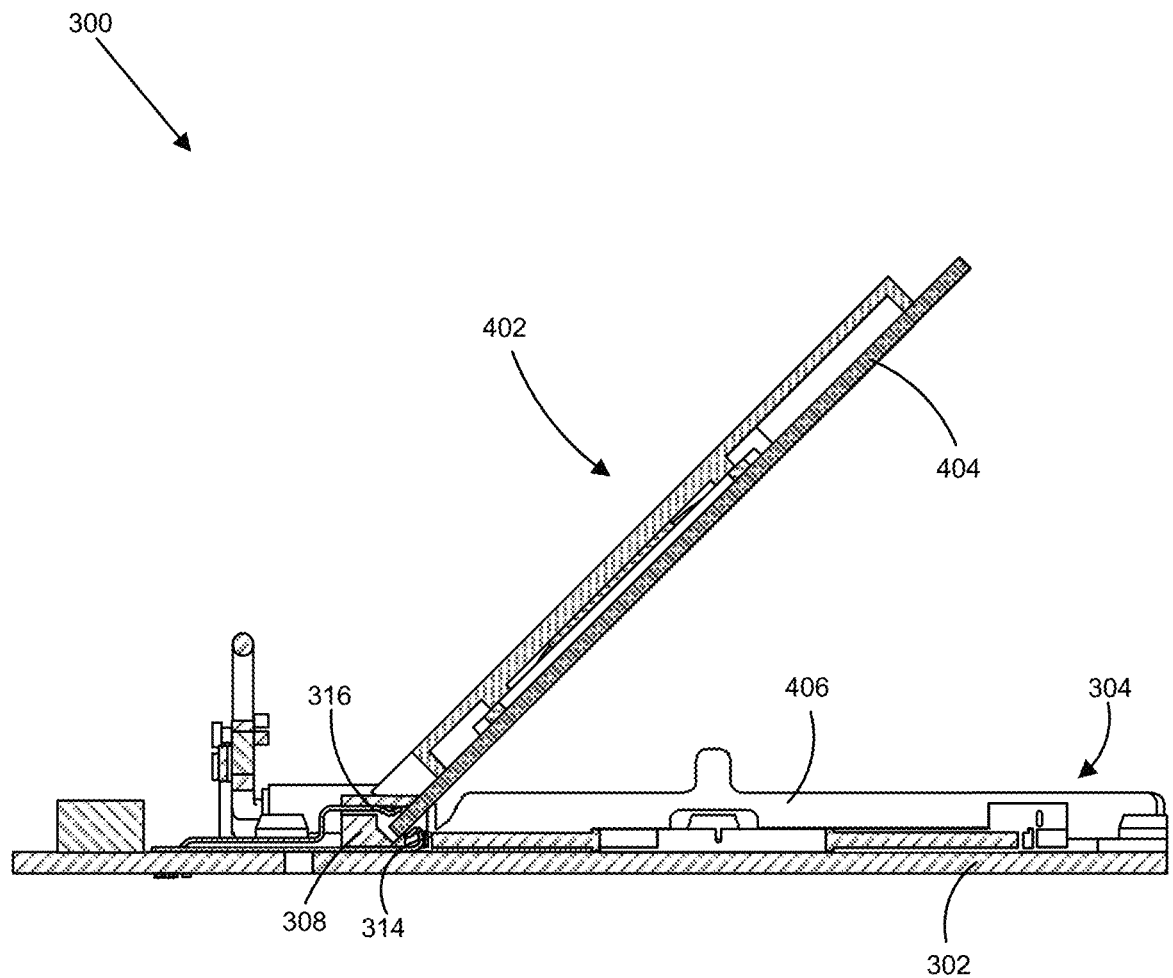
FIG. 4 illustrates another cross-sectional view of the example package mount arrangement of FIG. 3 with a semiconductor package, according to various embodiments.

FIG. 4 illustrates another cross-sectional view of the example package mount arrangement 300 of FIG. 3 with a semiconductor package 402, according to various embodiments. The semiconductor package 402 may include one or more of the features of the semiconductor package 112 (FIG. 1).

The semiconductor package 402 may be partially inserted within the socket arrangement 304, wherein a portion of the semiconductor package 402 is located within the header 308 of the socket arrangement 304. In particular, the semiconductor package 402 may be inserted within the socket arrangement 304 at an angle to the PCB 302, wherein the portion of the semiconductor package 402 located within the header 308 may be a portion of a component package 404 of the semiconductor package 402.

The portion of the semiconductor package 402 may be located between the first contact 314 and the second contact 316 within the header 308 when the semiconductor package 402 is partially inserted within the socket arrangement 304. The portion of the semiconductor package 402 may be isolated from the first contact 314 and the second contact 316, may be in contact with the first contact 314, may be in contact with the second contact 316, or some combination thereof.

In some embodiments, the stage of partially inserting the semiconductor package 402 into the socket arrangement 304 at an angle may be omitted. For example, the semiconductor package 402 may be slid, parallel to the body 406 of the socket arrangement 304, into the header 308, such that the semiconductor package 402 proceeds to the fully inserted stage illustrated in FIG. 5 without proceeding through the intermediate, partially inserted stage illustrated in FIG. 4.

Figure 5:
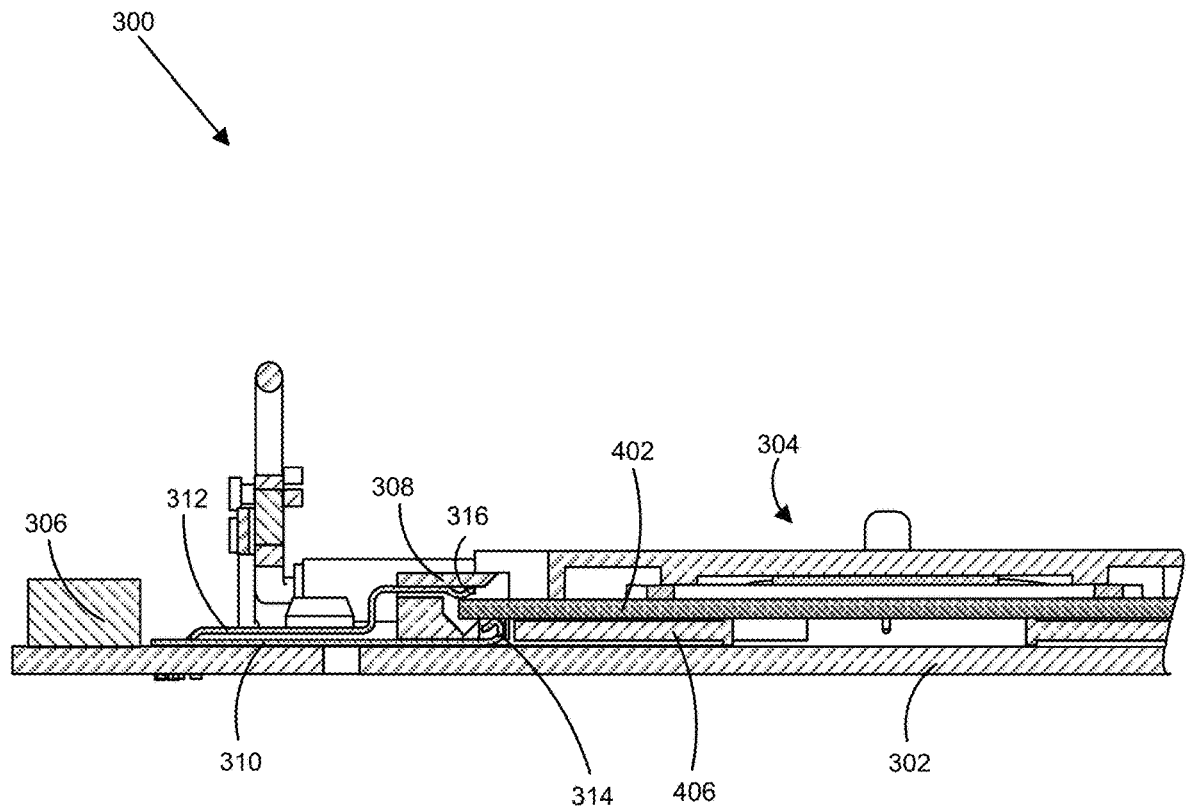
FIG. 5 illustrates another cross-sectional view of the example package mount arrangement of FIG. 3 with the semiconductor package, according to various embodiments.

FIG. 5 illustrates another cross-sectional view of the example package mount arrangement 300 of FIG. 3 with the semiconductor package 402, according to various embodiments. The semiconductor package 402 may be fully inserted within the socket arrangement 304, wherein the portion of the semiconductor package 402 is located within the header 308 of the socket arrangement 304. In embodiments where the semiconductor package 402 is inserted into the socket arrangement 304 at an angle, as illustrated in FIG. 4, the semiconductor package 402 may be transitioned from the partially inserted stage to the fully inserted stage by rotating semiconductor package 402 about the portion of the semiconductor package 402 located within the header 308 until the semiconductor package 402 is substantially parallel (within five degrees) to the PCB 302.

The portion of the semiconductor package 402 may be located between the first contact 314 and the second contact 316 within the header 308 when the semiconductor package 402 is fully inserted within the socket arrangement 304. The portion of the semiconductor package 402 may be in contact with both the first contact 314 and the second contact 316 when in the fully inserted stage. In particular, a power supply contact (such as the power supply contact 126 (FIG. 1)) of the semiconductor package 402 may contact the first contact 314 and a ground contact (such as the ground contact 128 (FIG. 1)) of the semiconductor package 402 may contact the second contact 316. The power supply contact may be coupled with the first contact 314 when the power supply contact is in contact with the first contact 314 and the ground contact may be coupled with the second contact 316 when the ground contact is in contact with the second contact 316. Accordingly, the first bus bar 310 and the second bus bar 312 may be coupled to the power supply contact and the ground contact, respectively. Power may be provided from the power source 306 to the semiconductor package 402 via the first bus bar 310 and the second bus bar 312 when the first bus bar 310 and the second bus bar 312 are coupled to the power supply contact and the ground contact, respectively. The first bus bar 310 and the second bus bar 312 may provide a first pathway for power to be provided to the semiconductor package 402 from the power source 306.

A plurality of pins (such as the plurality of pins 116 (FIG. 1)) located in the body 406 of the socket arrangement 304 may be coupled to a plurality of contacts (such as the plurality of contacts 146 (FIG. 1)) of the semiconductor package 402 when the semiconductor package 402 is inserted within the socket arrangement 304. Further, the plurality of pins may be coupled to a plurality of contacts (such as the plurality of contacts 118 (FIG. 1)) of the PCB 102. The plurality of contacts of the PCB 102 may be coupled to one or more traces (such as the first power trace line 106 (FIG. 1), the second power trace line 108 (FIG. 1), the first ground trace line 130 (FIG. 1), and/or the second ground trace line 132 (FIG. 1)) within the PCB 102. The plurality of contacts of the PCB 102 may couple the plurality of contacts of the semiconductor package 402 to the power supply connection (to which the first bus bar 310 is coupled), the ground connection (to which the second bus bar 312 is coupled), I/O connections, or some combination thereof. Accordingly, the plurality of pins and the traces of the PCB 102 may provide a second pathway for power to be provided to the semiconductor package 402 from the power source 306.

Figure 6:
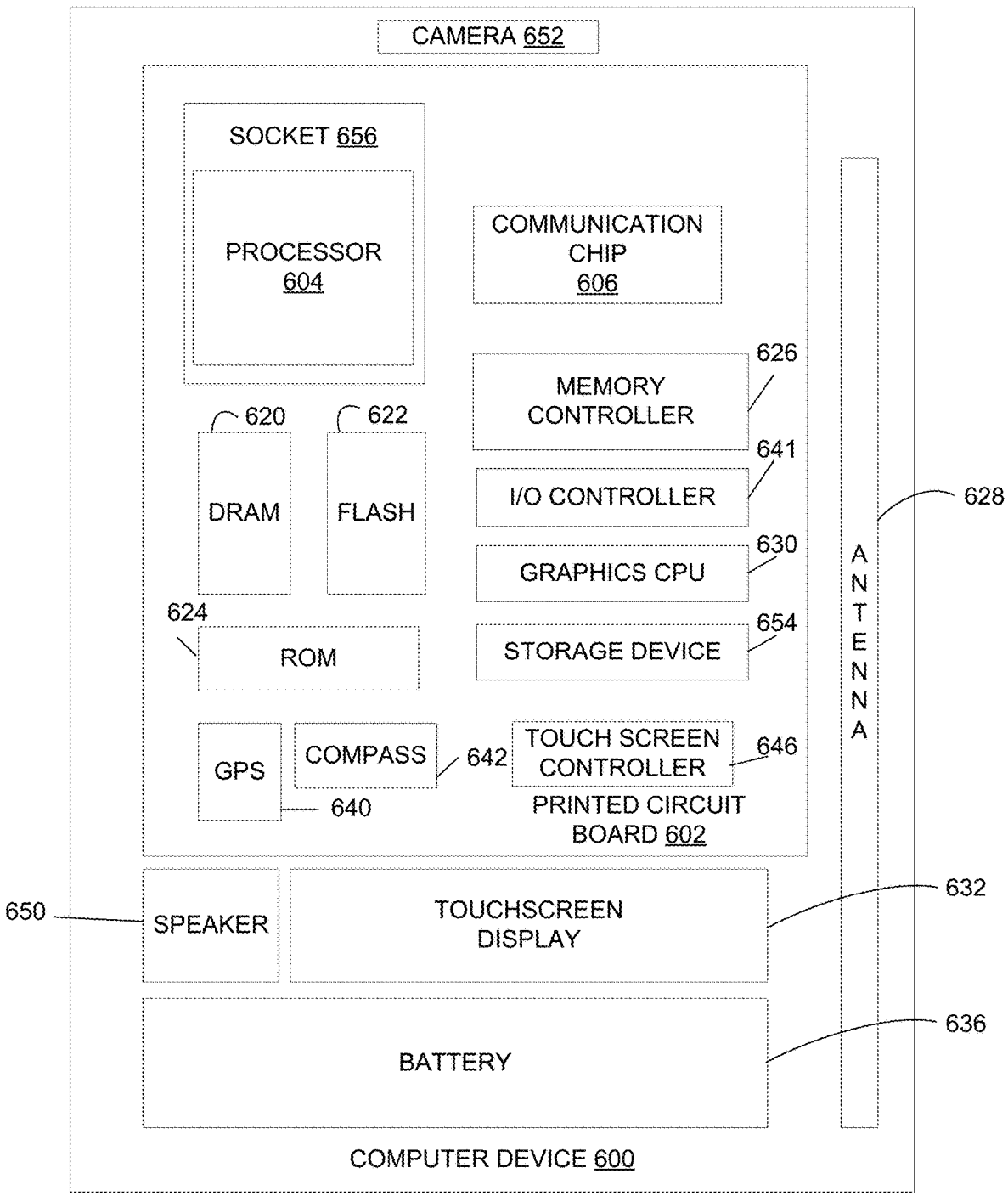
FIG. 6 illustrates an example computer device that may employ the apparatuses and/or methods described herein.

FIG. 6 illustrates an example computer device 600 that may employ the apparatuses and/or methods described herein (e.g., circuit board assembly 100, the socket arrangement 200, and/or the package mount arrangement 300), in accordance with various embodiments. As shown, computer device 600 may include a number of components, such as one or more processor(s) 604 (one shown) and at least one communication chip 606. In various embodiments, the one or more processor(s) 604 each may include one or more processor cores. In various embodiments, the at least one communication chip 606 may be physically and electrically coupled to the one or more processor(s) 604. In further implementations, the communication chip 606 may be part of the one or more processor(s) 604. In various embodiments, computer device 600 may include printed circuit board (PCB) 602. For these embodiments, the one or more processor(s) 604 and communication chip 606 may be disposed thereon. In alternate embodiments, the various components may be coupled without the employment of PCB 602.

Depending on its applications, computer device 600 may include other components that may or may not be physically and electrically coupled to the PCB 602. These other components include, but are not limited to, memory controller 626, volatile memory (e.g., dynamic random access memory (DRAM) 620), non-volatile memory such as read only memory (ROM) 624, flash memory 622, storage device 654 (e.g., a hard-disk drive (HDD)), an I/O controller 641, a digital signal processor (not shown), a crypto processor (not shown), a graphics processor 630, one or more antenna 628, a display (not shown), a touch screen display 632, a touch screen controller 646, a battery 636, an audio codec (not shown), a video codec (not shown), a global positioning system (GPS) device 640, a compass 642, an accelerometer (not shown), a gyroscope (not shown), a speaker 650, a camera 652, and a mass storage device (such as hard disk drive, a solid state drive, compact disk (CD), digital versatile disk (DVD)) (not shown), and so forth.

In some embodiments, the one or more processor(s) 604, flash memory 622, and/or storage device 654 may include associated firmware (not shown) storing programming instructions configured to enable computer device 600, in response to execution of the programming instructions by one or more processor(s) 604, to practice all or selected aspects of the methods described herein. In various embodiments, these aspects may additionally or alternatively be implemented using hardware separate from the one or more processor(s) 604, flash memory 622, or storage device 654.

In various embodiments, one or more components of the computer device 600 may include a socket arrangement 656. The socket arrangement 656 may include one or more of the features of the socket arrangement 110 (FIG. 1), the socket arrangement 200 (FIG. 2), the socket arrangement 304 (FIG. 3), or some combination thereof. The socket arrangement 656 may be utilized for mounting the processor 604 to the PCB 602 and may provide coupling between the processor 604 and the PCB 602. In other embodiments, the socket arrangement 656 may be utilized for mounting one or more of the other components of computer device 600 to the PCB 602.

The communication chips 606 may enable wired and/or wireless communications for the transfer of data to and from the computer device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 600 may include a plurality of communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others.

In various implementations, the computer device 600 may be a laptop, a netbook, a notebook, an ultrabook, a smartphone, a computer tablet, a personal digital assistant (PDA), an ultra-mobile PC, a mobile phone, a desktop computer, a server, a printer, a scanner, a monitor, a set-top box, an entertainment control unit (e.g., a gaming console or automotive entertainment unit), a digital camera, an appliance, a portable music player, or a digital video recorder. In further implementations, the computer device 600 may be any other electronic device that processes data.

Figure 7:
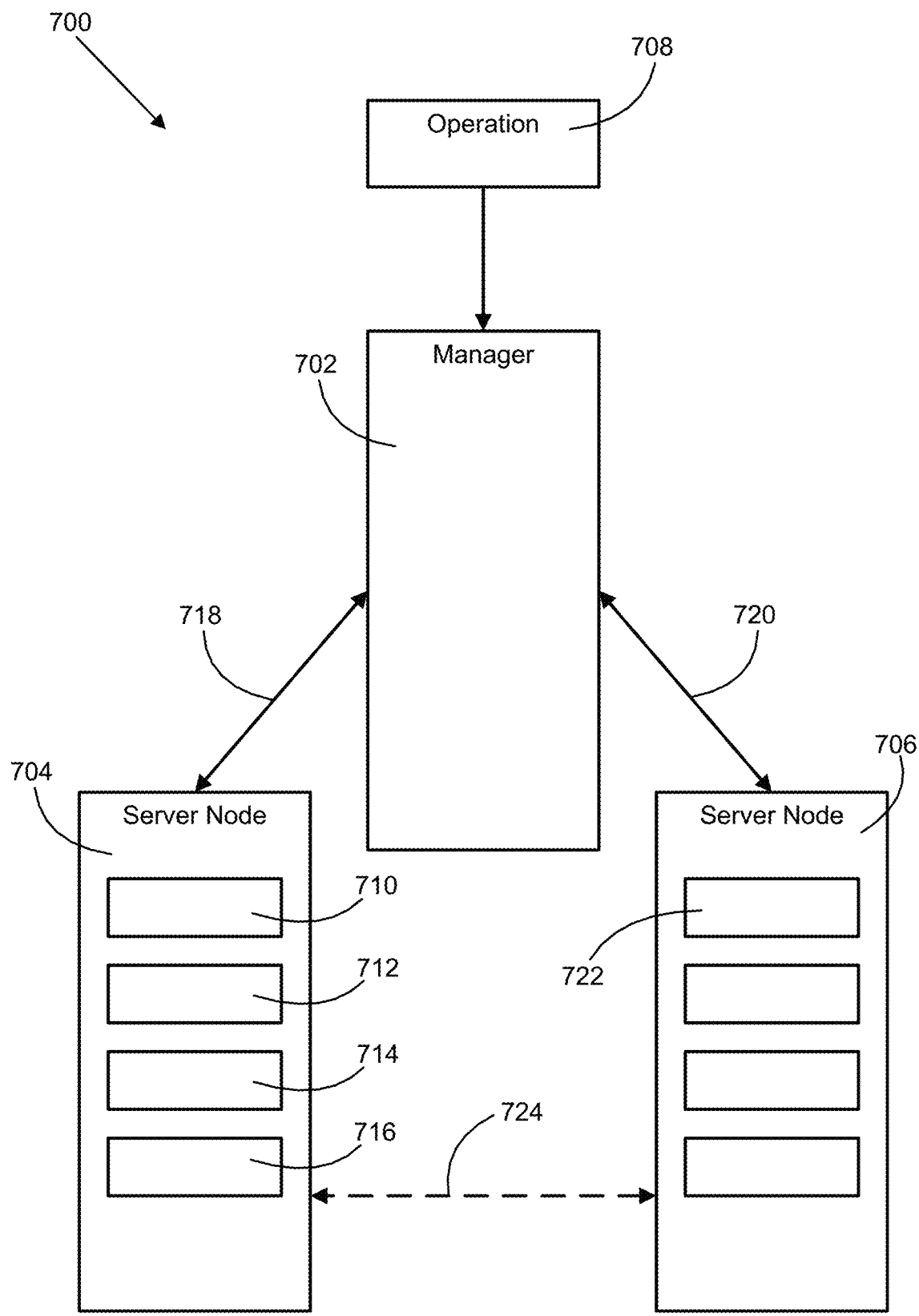
FIG. 7 illustrates an example computing node arrangement, according to various embodiments.

FIG. 7 illustrates an example computing node arrangement 700, according to various embodiments. The computing node 700 may include a manager 702 and one or more server nodes, such as server node 704 and server node 706. The one or more server nodes may be communicatively coupled to the manager 702, thereby allowing communication between the between the server nodes and the manager 702 (as illustrated by communication link 718 and communication link 720). The manager 702 and each of the server nodes may be referred to as a computing node. The following description refers to the server node 704 and the server node 706, however, it is to be understood that any of the server nodes within the one or more server nodes may include one or more of the feature of the server node 704, the server node 706, or some combination thereof.

The manager 702 may receive an operation 708 to be performed. The manager 702 may include one or more communication chips, such as the communication chips 606 (FIG. 6). The manager 702 may wirelessly receive or wiredly receive the operation 708 from a requesting device via the communication chips. The manager 702 may separate the operation 708 into one or more discrete operations and/or data groupings for storage.

The server node 704 may be a server rack. The server node 704 may include one or more drawers (which may also be referred to as sleds), such as drawer 710, drawer 712, drawer 714, and drawer 716. The server node 704 may be arranged in a pooled-by-node arrangement. In the pooled-by-node arrangement, each of the drawers of the server node 704 may include one or more components to provide a certain resource type. The resource types may include a network resource type, a storage resource type, and a compute resource type. For example, the drawer 710, the drawer 712, the drawer 714, and the drawer 716 may each include components to provide a compute resource type.

In other embodiments, the server node 704 may be arranged in a pooled-by-drawer arrangement. In the pooled-by-drawer arrangement, each of the drawers may include one or more components to provide a certain resource type, but each of the drawers may include components to provide a different resource type than provided by the components within another one of the drawers of the server node 704. For example, the drawer 710 may include components to provide a network resource type, the drawer 712 may include components to provide a storage resource type, and the drawer 714 may include components to provide a compute resource type.

Further, in other embodiments, the server node 704 may be arranged in a heterogeneous arrangement. In the heterogeneous arrangement, each of the drawers may include components to provide multiple resource types. Each of the drawers may include components to provide all the resource types or some portion of the resource types. For example, the drawer 710 may include components to provide a network resource type, components to provide a storage resource type, and components to provide a compute resource type.

In some embodiments, the server node 704 may be arranged in a combination of the pooled-by-drawer arrangement and the heterogeneous arrangement. In these embodiments, a first portion of the drawers of the server node 704 may be arranged in the pooled-by-drawer arrangement and a second portion of the drawers may be arranged in the heterogeneous arrangement.

The drawers of the server node 704 may be interchangeable, such that any of the drawers of the server node 704 may be removed and replaced by a different drawer. The replacement drawer may have a same arrangement as the drawer removed or may have a different arrangement than the drawer that was removed. Accordingly, the server node 704 may be transitioned among the pooled-by-node arrangement, the pooled-by-drawer arrangement, the heterogeneous arrangement, or some combination thereof via replacing the drawers of the server node 704. Further, a malfunctioning drawer may be removed and replaced by a properly functioning drawer to limit downtime of the drawer and allow repair of the malfunctioning drawer without having to take the server node 704 offline.

The server node 706 may include one or more of the features of the server node 704. The server node 706 may have a same arrangement as the server node 704 or may have a different arrangement than the server node 704. For example, the server node 704 may be arranged in a pooled-by-node arrangement and the server node 706 may be arranged in a pooled-by-drawer arrangement.

As stated above, the resource types may include the network resource type, the storage resource type, and the compute resource type. The network resource type may include one or more components that may provide networking capability. The components included in the network resource type may include one or more I/O controllers (such as the I/O controller 641 (FIG. 6)), one or more communication chips (such as the communication chips 606 (FIG. 6)), one or more antennas (such as the antenna 628 (FIG. 6)), or some combination thereof In some embodiments, the components included in the network resource type may include other components that provide networking capability known to one having ordinary skill in the art.

The storage resource type may include one or more components that may provide storage capability. The components included in the storage resource type may include one or more memory controllers (such as the memory controller 626 (FIG. 6)), one or more storage devices (such as the storage device 654 (FIG. 6), one or more DRAMs (such as the DRAM 620 (FIG. 6)), one or more flash memories (such as the flash memory 622 (FIG. 6)), one or more ROMs (such as the ROM 624 (FIG. 6), one or more volatile memory devices, one or more non-volatile memory devices, one or more mass storage devices (such as hard disk drives, solid state drives, compact disks (CDs), digital versatile disks (DVDs)), or some combination thereof. In some embodiments, the components included in the storage resource type may include other components that provide storage capability known to one having ordinary skill in the art.

The compute resource type may include one or more components that may provide computing capability. The components included in the compute resource type may include one or more processors (such as the processor 604 (FIG. 6)), one or more graphics processors (such as the graphics processor 630 (FIG. 6)), one or more digital signal processors, one or more crypto processors, one or more video codecs, one or more audio codecs, or some combination thereof In some embodiments, the components included in the compute resource type may include other components that provide computing capability known to one having ordinary skill in the art.

In some embodiments, the resource types may include other resource types not described, but would be understood to be other resource types that may be provided by a server rack known to one have skill in the art. Further, in some embodiments, the resource types described may be divided into narrower resource types, where each of the narrower resource types may include some portion of the components described above in relation to the network resource type, the storage resource type, and the compute resource type.

After separating the operation 708 into one or more discrete operations and/or data groupings for storage, the manager 702 may direct each of the discrete operations and/or data groupings for storage to a corresponding drawer of the server node 704 and/or the server node 706 that provides the resource type to perform the discrete operation or store the data grouping. For example, the manager 702 may separate the operation 708 into a calculation operation and a group of data to be stored. The manager 702 may direct, via the communication link 718, the calculation operation to the drawer 710 of the server node 704, which may provide the compute resource type, and may direct, via the communication link 720, the group of data to be stored to drawer 722 of the server node 706, which may provide the storage resource type.

After directing the discrete operations and/or the data groupings for storage to the corresponding drawers, the manager 702 may retrieve the results of the discrete operations and/or the data groupings at a time when the results of the operation 708 are to be returned to the requesting device via the communication chips. The manager 702 may combine the results of the discrete operations and/or the data groupings to generate the results of the operation 708 and may return the results of the operation 708 to the requesting device via the communication chips.

In instances where the discrete operations are completed prior to the time when the results of the operation 708 are to be returned to the requesting device, the manager 702 may receive the results of the discrete operations and may direct the results of the discrete operations to a drawer providing the storage resource type for storage. The manager 702 may then retrieve the results of the discrete operations from the drawer providing the storage resource type at the time when the results of the operation 708 are to be returned to the requesting device.

In some embodiments, the manager 702 may be omitted from the computing node arrangement 700. In these embodiments, one or more drawers of one of the server nodes may perform the operations of the manager 702. For example, the drawer 710 of the server node 704 may perform the operations of the manager 702 and may direct the discrete operations and/or data groupings to other drawers within the server node 704 and/or within the server node 706. Further, in these embodiments, the server node with the drawer that performs the operations of the manager 702 may be communicatively coupled to the other server nodes within the computing node arrangement 700 (as illustrated by communication link 724).

One or more of the computing nodes within the computing node arrangement 700, and/or the drawers within the computing nodes, may include, and/or may be, a computer device (such as the computer device 600 (FIG. 6)). Further, one or more of the computing nodes within the computing node arrangement 700 and/or the drawers within the computing nodes may employ the apparatuses described herein (e.g., the circuit board assembly 100 (FIG. 1), the socket arrangement 110 (FIG. 1), the socket arrangement 200 (FIG. 2), the package mount arrangement 300 (FIG. 3), and the socket arrangement 304 (FIG. 3)), in accordance with various embodiments. For example, one or more components (including the network resource type components, the storage resource type components and the compute resource type components) may be mounted within one or more of the drawers (including the drawer 710, the drawer 712, the drawer 714, the drawer 716, and the drawer 722) via the socket arrangement 110, the socket arrangement 200, the socket arrangement 304, or some combination thereof. Further, one or more of the communication chips may be mounted within the manager 702 via the socket arrangement 110, the socket arrangement 200, the socket arrangement 304, or some combination thereof.

Figure 8:
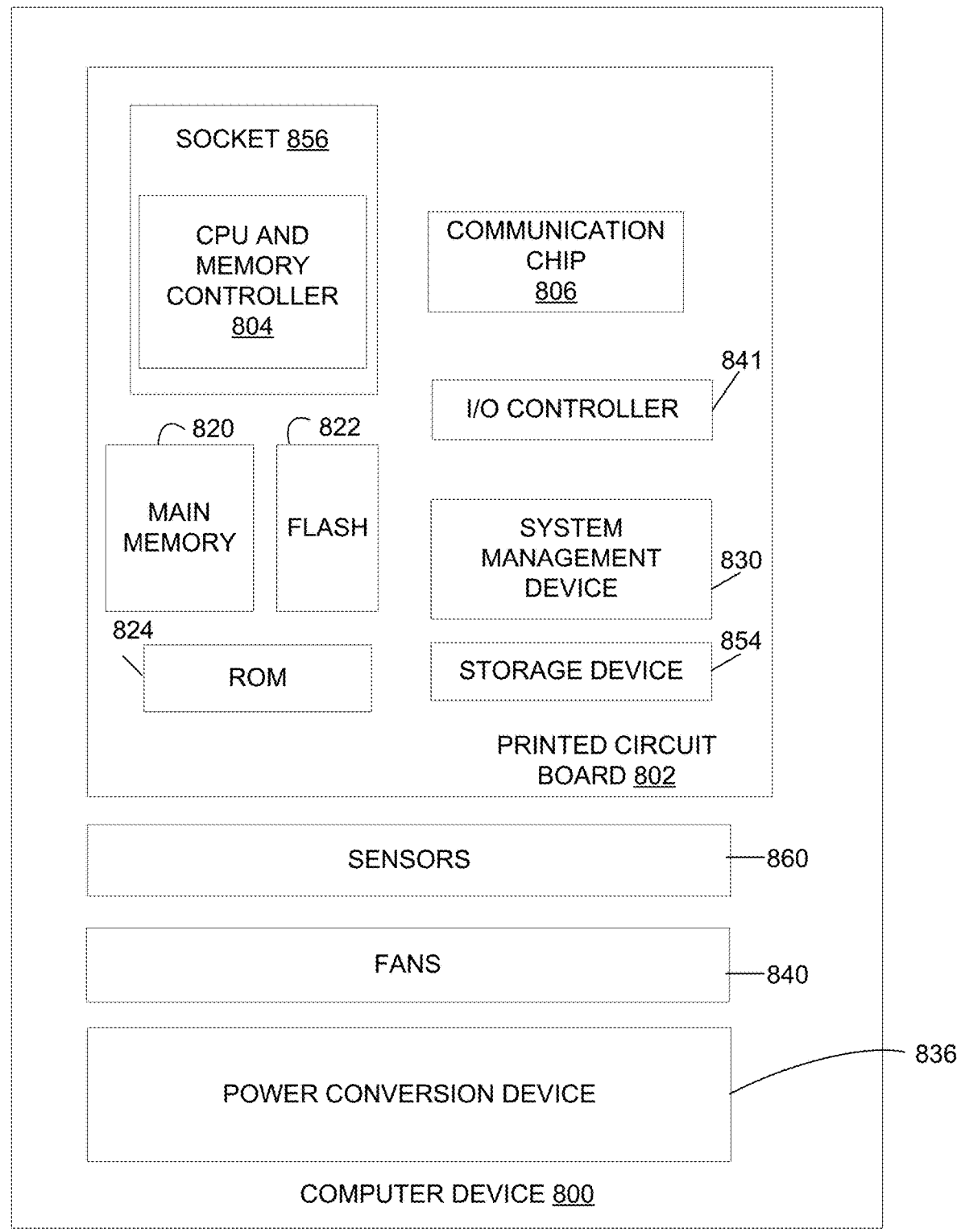
FIG. 8 illustrates another example computer device that may employ the apparatuses and/or methods described herein.

FIG. 8 illustrates an example computer device 800 that may employ the apparatuses and/or methods described herein (e.g., circuit board assembly 100, the socket arrangement 200, and/or the package mount arrangement 300), in accordance with various embodiments. As shown, computer device 800 may include a number of components, such as one or more processor and memory controller device(s) 804 (one shown) and at least one communication chip 806. In various embodiments, the one or more processor and memory controller device(s) 804 each may include one or more processor cores. In various embodiments, the at least one communication chip 806 may be physically and electrically coupled to the one or more processor and memory controller device(s) 804. In further implementations, the communication chip 806 may be part of the one or more processor and memory controller device(s) 804.

Further, in various embodiments, a system management device 830 (such as baseboard management controller (BMC)) may be coupled to the one or more processor and memory controller device(s) 804. The system management device 830 may monitor the state of the computer device 800 via one or more sensors 860. The one or more sensors 860 may sense the physical state of the computer device 800, such as a temperature of the computer device 800. In some embodiments, the system management device 830 may communicate with the one or more processor and memory controller device(s) 804 through an independent connection. Further, in some embodiments, the system management device 830 and/or the sensors 860 may be omitted.

In various embodiments, computer device 800 may include printed circuit board (PCB) 802. For these embodiments, the one or more processor and memory controller device(s) 804 and communication chip 806 may be disposed thereon. In alternate embodiments, the various components may be coupled without the employment of PCB 802. Depending on its applications, computer device 800 may include other components that may or may not be physically and electrically coupled to the PCB 802. These other components include, but are not limited to, main memory (e.g., volatile memory, non-volatile memory, and/or dynamic random access memory (DRAM) 820), read-only memory (ROM) 824, flash memory 822, storage device 854 (e.g., a hard-disk drive (HDD)), an I/O controller 841, a digital signal processor (not shown), a crypto processor (not shown), a system management device 830, a display (not shown), a power conversion device 836, an audio codec (not shown), a video codec (not shown), and a mass storage device (such as hard disk drive, a solid state drive, compact disk (CD), digital versatile disk (DVD)) (not shown), and so forth.

In various embodiments, the computer device 800 may include one or more fans 840. The one or more fans 840 may be directed at and/or mounted to one or more of the components within the computer device 800. In some embodiments, the one or more fans 840 may be coupled to the one or more processor and memory controller device(s) 804 and/or the system management device 830, which may control operation of the one or more fans 840.

In some embodiments, the one or more processor and memory controller device(s) 804, flash memory 822, and/or storage device 854 may include associated firmware (not shown) storing programming instructions configured to enable computer device 800, in response to execution of the programming instructions by one or more processor and memory controller device(s) 804, to practice all or selected aspects of the methods described herein. In various embodiments, these aspects may additionally or alternatively be implemented using hardware separate from the one or more processor and memory controller device(s) 804, flash memory 822, or storage device 854.

In various embodiments, one or more components of the computer device 800 may include a socket arrangement 856. The socket arrangement 856 may include one or more of the features of the socket arrangement 110 (FIG. 1), the socket arrangement 200 (FIG. 2), the socket arrangement 304 (FIG. 3), or some combination thereof. The socket arrangement 856 may be utilized for mounting the one or more processor and memory controller device(s) 804 to the PCB 802 and may provide coupling between the one or more processor and memory controller device(s) 804 and the PCB 802. In other embodiments, the socket arrangement 856 may be utilized for mounting one or more of the other components of computer device 800 to the PCB 802.

The communication chips 806 may enable wired and/or wireless communications for the transfer of data to and from the computer device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 806 may implement any of a number of wireless standards or protocols, including but not limited to IEEE 802.20, Long Term Evolution (LTE), LTE Advanced (LTE-A), General Packet Radio Service (GPRS), Evolution Data Optimized (Ev-DO), Evolved High Speed Packet Access (HSPA+), Evolved High Speed Downlink Packet Access (HSDPA+), Evolved High Speed Uplink Packet Access (HSUPA+), Global System for Mobile Communications (GSM), Enhanced Data rates for GSM Evolution (EDGE), Code Division Multiple Access (CDMA), Time Division Multiple Access (TDMA), Digital Enhanced Cordless Telecommunications (DECT), Worldwide Interoperability for Microwave Access (WiMAX), Bluetooth, derivatives thereof, as well as any other wireless protocols that are designated as 3G, 4G, 5G, and beyond. The computer device 800 may include a plurality of communication chips 806. For instance, a first communication chip 806 may be dedicated to shorter range wireless communications such as Wi-Fi and Bluetooth, and a second communication chip 806 may be dedicated to longer range wireless communications such as GPS, EDGE, GPRS, CDMA, WiMAX, LTE, Ev-DO, and others.

In various implementations, the computer device 800 may be a server. In other implementations, the computer device 800 may be, or components of the computer device 800 may be implemented in, a laptop, a netbook, a notebook, an ultrabook, a smartphone, a computer tablet, a personal digital assistant (PDA), an ultra-mobile PC, a mobile phone, a desktop computer, a printer, a scanner, a monitor, a set-top box, an entertainment control unit (e.g., a gaming console or automotive entertainment unit), a digital camera, an appliance, a portable music player, or a digital video recorder. In further implementations, the computer device 800 may be any other electronic device that processes data.

Example 1 may include a socket for a component package, comprising a header to mount to a printed circuit board (PCB), the header to receive the component package, a first bus bar coupled to the header, wherein the first bus bar extends from the header adjacent to the PCB when the header is mounted to the PCB, and electrically couples to a power supply contact of the component package and to a power supply connection within a proximity of a power source located on the PCB when the header has received the component package and is mounted to the PCB, wherein a power output of the power source is electrically coupled to the power supply connection and is to provide power to the component package via the first bus bar, and a second bus bar coupled to the header, wherein the second bus bar extends from the header adjacent to the PCB when the header is mounted to the PCB, and electrically couples to a ground contact of the component package and a ground connection within the proximity of the power source when the header has received the component package and is mounted to the PCB, wherein the ground connection is to couple to a ground of the PCB.

Example 2 may include the socket of example 1, wherein the power supply connection includes a first conduction portion of the PCB, the first conductive portion electrically coupled to the power output of the power source, wherein to electrically couple the first bus bar to the power supply connection includes to solder a portion of the first bus bar to the first conductive portion, wherein the ground connection is a second conductive portion of the PCB, the second conductive portion electrically coupled to the ground of the PCB, and wherein to electrically couple the second bus bar to the ground connection includes to solder a portion of the second bus bar to the second conductive portion.

Example 3 may include the socket of examples 1 or 2, wherein the first bus bar electrically couples to the power supply contact at a first end of the first bus bar and to the power supply connection at a second end of the first bus bar when the header has received the component package and is mounted to the PCB, the first end of the first bus bar being opposite to the second end of the first bus bar, and wherein the second bus bar electrically couples to the ground contact at a first end of the second bus bar and the ground connection at a second end of the second bus bar when the header has received the component package and is mounted to the PCB, the first end of the second bus bar being opposite to the second end of the second bus bar.

Example 4 may include the socket of examples 1 or 2, wherein the first bus bar electrically couples to the power supply contact at a first side of the component package when the header has received the component package, and wherein the second bus bar electrically couples to the ground contact at a second side of the component package when the header has received the component package, the second side of the component package being opposite to the first side of the component package.

Example 5 may include the socket of examples 1 or 2, further comprising a body coupled to the header and to mount to the PCB, the body to mount the component package to the PCB and maintain a portion of the component package within the header, wherein the portion of the component package within the header contacts with the first bus bar and the second bus bar when the header has received the component package.

Example 6 may include the socket of example 5, wherein the body includes a plurality of pins to electrically couple to a plurality of contacts on a side of the component package.

Example 7 may include the socket of example 6, wherein the ground contact is located on the side of the component package adjacent to the plurality of contacts, and wherein the second bus bar electrically couples to the ground contact adjacent to where the plurality of pins are to electrically couple to the plurality of contacts when the header has received the component package.

Example 8 may include the socket of examples 1 or 2, wherein the power source is a voltage regulator.

Example 9 may include a computer device, comprising a printed circuit board (PCB), a power source mounted to the PCB at a first location, a component package, the power source to supply power to the component package and a socket that includes a body mounted to the PCB at a second location, the second location separate from the first location, wherein the body mounts the component package to the PCB, a header coupled to the body, wherein a portion of the component package extends into the header, a first bus bar coupled to the header, wherein the first bus bar is electrically coupled to a power supply contact of the component package within the header, wherein the first bus bar extends from the header adjacent to the PCB and is electrically coupled to a power supply connection within a proximity of the power source, and wherein a power output of the power source is electrically coupled to the power supply connection and is to provide power to the component package via the first bus bar, and a second bus bar coupled to the header, wherein the second bus bar is electrically coupled to a ground contact of the component package within the header, and wherein the second bus bar extends from the header adjacent to the PCB and is electrically coupled to a ground connection within the proximity of the power source, the ground connection coupled to a ground of the PCB.

Example 10 may include the computer device of example 9, wherein the power supply connection is a first conductive portion of the PCB, wherein the first bus bar is electrically coupled to the power supply connection via solder coupled to a portion of the first bus bar and the first conductive portion, wherein the ground connection is a second conductive portion of the PCB, and wherein the second bus bar is electrically coupled to the ground connection via solder coupled to a portion of the second bus bar and the second conductive portion.

Example 11 may include the computer device of example 10, wherein the first conductive portion is located within a first layer of the PCB, and wherein the second conductive portion is located within a second layer of the PCB.

Example 12 may include the computer device of any of examples 9-11, wherein the first bus bar is electrically coupled to the power supply contact at a first end of the first bus bar, wherein the first bus bar is electrically coupled to the power supply connection at a second end of the first bus bar, the second end of the first bus bar opposite to the first end of the first bus bar, wherein the second bus bar is electrically coupled to the ground contact at a first end of the second bus bar, and wherein the second bus bar is electrically coupled to the ground connection at a second end of the second bus bar, the second end of the second bus bar opposite to the first end of the second bus bar.

Example 13 may include the computer device of any of examples 9-11, wherein the first bus bar is electrically coupled to the power supply contact at a first side of the component package, and wherein the second bus bar is electrically coupled to the ground contact at a second side of the component package, the second side of the component package opposite to the first side of the component package.

Example 14 may include the computer device of any of examples 9-11, wherein the body includes a plurality of pins that electrically couple a plurality of contacts of the PCB and a plurality of contacts on the component package.

Example 15 may include the computer device of example 14, wherein the second bus bar is electrically coupled to the ground contact on a side of the component package, and wherein the plurality of pins are electrically coupled to the plurality of contacts of the component package on the side of the component package.

Example 16 may include the computer device of example 15, wherein the second bus bar is electrically coupled to the ground contact adjacent to where the plurality of pins are electrically coupled to the plurality of contacts of the component package.

Example 17 may include the computer device of any of examples 9-11, further comprising a die mounted to component package, wherein the component package electrically couples the power supply contact and the ground contact to the die.

Example 18 may include the computer device of example 17, wherein the die is mounted to a side of the component package, and wherein the first bus bar is electrically coupled to the power supply contact on the side of the component package.

Example 19 may include the computer device of any of examples 9-11, wherein the power supply contact is a first power supply contact and the ground contact is a first ground contact, wherein the PCB includes a first conductive feature coupled to the power output of the power source and a second conductive feature coupled to the ground of the PCB, wherein the body includes a plurality of pins that electrically couple the first conductive feature to a second power supply contact of the component package and the second conductive feature to a second ground contact of the component package, and wherein the component package includes a first conductive pathway that couples the first power supply contact and the second power supply contact, and a second conductive pathway that couples the first ground contact and the second ground contact.

Example 20 may include the computer device of any of examples 9-11, wherein the power supply is a voltage regulator.

Example 21 may include a circuit board assembly, comprising a printed circuit board (PCB), a power source mounted to the PCB, and a socket mounted to the PCB, wherein the socket includes a body to receive a component package, a header coupled to the body, wherein a portion of the component package is to extend into the header when the body receives the component package, a first bus bar coupled to the header, wherein the first bus bar is to electrically couple to a power supply contact of the component package within the header, wherein the first bus bar extends from the header adjacent to the PCB and is electrically coupled to a power supply connection within a proximity of the power source, and wherein a power output of the power source is electrically coupled to the power supply connection and is to provide power to the component package via the first bus bar, and a second bus bar coupled to the header, wherein the second bus bar is to electrically couple to a ground contact of the component package within the header, and wherein the second bus bar extends from the header adjacent to the PCB and is electrically coupled to a ground connection within the proximity of the power source, the ground connection coupled to a ground of the PCB.

Example 22 may include the circuit board assembly of example 21, wherein the power supply connection is a first conductive portion of the PCB, wherein the first bus bar is electrically coupled to the power supply connection via solder coupled to a portion of the first bus bar and the first conductive portion, wherein the ground connection is a second conductive portion of the PCB, and wherein the second bus bar is electrically coupled to the ground connection via solder coupled to a portion of the second bus bar and the second conductive portion.

Example 23 may include the circuit board assembly of example 22, wherein the first conductive portion is located within a first layer of the PCB, and wherein the second conductive portion is located within a second layer of the PCB.

Example 24 may include the circuit board assembly of any of examples 21-23, wherein the first bus bar is to electrically couple to the power supply contact at a first end of the first bus bar, wherein the first bus bar is electrically coupled to the power supply connection at a second end of the first bus bar, the second end of the first bus bar opposite to the first end of the first bus bar, wherein the second bus bar is to electrically couple to the ground contact at a first end of the second bus bar, and wherein the second bus bar is electrically coupled to the ground connection at a second end of the second bus bar, the second end of the second bus bar opposite to the first end of the second bus bar.

Example 25 may include the circuit board assembly of any of examples 21-23, wherein the first bus bar is to electrically couple to the power supply contact at a first side of the component package, and wherein the second bus bar is to electrically couple to the ground contact at a second side of the component package, the second side of the component package opposite to the first side of the component package.

Example 26 may include the circuit board assembly of any of examples 21-23, wherein the body includes a plurality of pins that are to electrically couple a plurality of contacts of the PCB and a plurality of contacts on the component package.

Example 27 may include the circuit board assembly of example 26, wherein the second bus bar is to electrically couple to the ground contact on a side of the component package, and wherein the plurality of pins is to electrically couple to the plurality of contacts of the component package on the side of the component package.

Example 28 may include the circuit board assembly of example 27, wherein the second bus bar is to electrically couple to the ground contact adjacent to where the plurality of pins is to electrically couple to the plurality of contacts of the component package.

Example 29 may include the circuit board assembly of any of examples 21-23, wherein the power supply contact is a first power supply contact and the ground contact is a first ground contact, wherein the PCB includes a first conductive feature coupled to the power output of the power source and a second conductive feature coupled to the ground of the PCB, wherein the body includes a plurality of pins that are to electrically couple the first conductive feature to a second power supply contact of the component package and the second conductive feature to a second ground contact of the component package, and wherein the second power supply contact is electrically coupled to the first power supply contact and the second ground contact is electrically coupled to the first ground contact.

Example 30 may include the circuit board assembly of any of examples 21-23, wherein the power supply is a voltage regulator.

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A socket arrangement for a component package, comprising:
   a header to mount to a printed circuit board (PCB), the header to receive the component package;
   a first bus bar coupled to the header, wherein the first bus bar extends from the header adjacent to the PCB when the header is mounted to the PCB, and electrically couples to a power supply contact of the component package and to a power supply connection within a proximity of a power source located on the PCB when the header has received the component package and is mounted to the PCB, wherein a power output of the power source is electrically coupled to the power supply connection and is to provide power to the component package via the first bus bar; and a second bus bar coupled to the header, wherein the second bus bar extends from the header adjacent to the PCB when the header is mounted to the PCB, and electrically couples to a ground contact of the component package and a ground connection within the proximity of the power source when the header has received the component package and is mounted to the PCB, wherein the ground connection is to couple to a ground of the PCB.

2. The socket arrangement of claim 1, wherein the power supply connection includes a first conduction portion of the PCB, the first conductive portion electrically coupled to the power output of the power source, wherein to electrically couple the first bus bar to the power supply connection includes to solder a portion of the first bus bar to the first conductive portion, wherein the ground connection is a second conductive portion of the PCB, the second conductive portion electrically coupled to the ground of the PCB, and wherein to electrically couple the second bus bar to the ground connection includes to solder a portion of the second bus bar to the second conductive portion.

3. The socket arrangement of claim 1, wherein the first bus bar electrically couples to the power supply contact at a first end of the first bus bar and to the power supply connection at a second end of the first bus bar when the header has received the component package and is mounted to the PCB, the first end of the first bus bar being opposite to the second end of the first bus bar, and wherein the second bus bar electrically couples to the ground contact at a first end of the second bus bar and the ground connection at a second end of the second bus bar when the header has received the component package and is mounted to the PCB, the first end of the second bus bar being opposite to the second end of the second bus bar.

4. The socket arrangement of claim 1, wherein the first bus bar electrically couples to the power supply contact at a first side of the component package when the header has received the component package, and wherein the second bus bar electrically couples to the ground contact at a second side of the component package when the header has received the component package, the second side of the component package being opposite to the first side of the component package.

5. The socket arrangement of claim 1, further comprising a body coupled to the header and to mount to the PCB, the body to mount the component package to the PCB and maintain a portion of the component package within the header, wherein the portion of the component package within the header contacts with the first bus bar and the second bus bar when the header has received the component package.

6. The socket arrangement of claim 5, wherein the body includes a plurality of pins to electrically couple to a plurality of contacts on a side of the component package.

7. The socket arrangement of claim 6, wherein the ground contact is located on the side of the component package adjacent to the plurality of contacts, and wherein the second bus bar electrically couples to the ground contact adjacent to where the plurality of pins are to electrically couple to the plurality of contacts when the header has received the component package.

8. The socket arrangement of claim 1, wherein the power source is a voltage regulator.

9. A computer device, comprising:
a printed circuit board (PCB);
a power source mounted to the PCB at a first location;
a component package, the power source to supply power to the component package; and
a socket arrangement that includes:
a body mounted to the PCB at a second location, the second location separate from the first location, wherein the body mounts the component package to the PCB;
a header coupled to the body, wherein a portion of the component package extends into the header;
a first bus bar coupled to the header, wherein the first bus bar is electrically coupled to a power supply contact of the component package within the header, wherein the first bus bar extends from the header adjacent to the PCB and is electrically coupled to a power supply connection within a proximity of the power source, and wherein a power output of the power source is electrically coupled to the power supply connection and is to provide power to the component package via the first bus bar; and
a second bus bar coupled to the header, wherein the second bus bar is electrically coupled to a ground contact of the component package within the header, and wherein the second bus bar extends from the header adjacent to the PCB and is electrically coupled to a ground connection within the proximity of the power source, the ground connection coupled to a ground of the PCB.

10. The computer device of claim 9, wherein the power supply connection is a first conductive portion of the PCB, wherein the first bus bar is electrically coupled to the power supply connection via solder coupled to a portion of the first bus bar and the first conductive portion, wherein the ground connection is a second conductive portion of the PCB, and wherein the second bus bar is electrically coupled to the ground connection via solder coupled to a portion of the second bus bar and the second conductive portion.

11. The computer device of claim 10, wherein the first conductive portion is located within a first layer of the PCB, and wherein the second conductive portion is located within a second layer of the PCB.

12. The computer device of claim 9, wherein the first bus bar is electrically coupled to the power supply contact at a first end of the first bus bar, wherein the first bus bar is electrically coupled to the power supply connection at a second end of the first bus bar, the second end of the first bus bar opposite to the first end of the first bus bar, wherein the second bus bar is electrically coupled to the ground contact at a first end of the second bus bar, and wherein the second bus bar is electrically coupled to the ground connection at a second end of the second bus bar, the second end of the second bus bar opposite to the first end of the second bus bar.

13. The computer device of claim 9, wherein the first bus bar is electrically coupled to the power supply contact at a first side of the component package, and wherein the second bus bar is electrically coupled to the ground contact at a second side of the component package, the second side of the component package opposite to the first side of the component package.

14. The computer device of claim 9, wherein the body includes a plurality of pins that electrically couple a plurality of contacts of the PCB and a plurality of contacts on the component package.

15. The computer device of claim 14, wherein the second bus bar is electrically coupled to the ground contact on a side of the component package, and wherein the plurality of pins are electrically coupled to the plurality of contacts of the component package on the side of the component package.

16. A circuit board assembly, comprising:
- a printed circuit board (PCB);
- a power source mounted to the PCB; and
- a socket arrangement mounted to the PCB, wherein the socket arrangement includes:
  - a body to receive a component package;
  - a header coupled to the body, wherein a portion of the component package is to extend into the header when the body receives the component package;
  - a first bus bar coupled to the header, wherein the first bus bar is to electrically couple to a power supply contact of the component package within the header, wherein the first bus bar extends from the header adjacent to the PCB and is electrically coupled to a power supply connection within a proximity of the power source, and wherein a power output of the power source is electrically coupled to the power supply connection and is to provide power to the component package via the first bus bar; and
  - a second bus bar coupled to the header, wherein the second bus bar is to electrically couple to a ground contact of the component package within the header, and wherein the second bus bar extends from the header adjacent to the PCB and is electrically coupled to a ground connection within the proximity of the power source, the ground connection coupled to a ground of the PCB.

17. The circuit board assembly of claim 16, wherein the power supply connection is a first conductive portion of the PCB, wherein the first bus bar is electrically coupled to the power supply connection via solder coupled to a portion of the first bus bar and the first conductive portion, wherein the ground connection is a second conductive portion of the PCB, and wherein the second bus bar is electrically coupled to the ground connection via solder coupled to a portion of the second bus bar and the second conductive portion.

18. The circuit board assembly of claim 17, wherein the first conductive portion is located within a first layer of the PCB, and wherein the second conductive portion is located within a second layer of the PCB.

19. The circuit board assembly of claim 16, wherein the first bus bar is to electrically couple to the power supply contact at a first end of the first bus bar, wherein the first bus bar is electrically coupled to the power supply connection at a second end of the first bus bar, the second end of the first bus bar opposite to the first end of the first bus bar, wherein the second bus bar is to electrically couple to the ground contact at a first end of the second bus bar, and wherein the second bus bar is electrically coupled to the ground connection at a second end of the second bus bar, the second end of the second bus bar opposite to the first end of the second bus bar.

20. The circuit board assembly of claim 16, wherein the first bus bar is to electrically couple to the power supply contact at a first side of the component package, and wherein the second bus bar is to electrically couple to the ground contact at a second side of the component package, the second side of the component package opposite to the first side of the component package.

\* \* \* \* \*